United States Patent
Yang et al.

(10) Patent No.: US 12,235,594 B2
(45) Date of Patent: *Feb. 25, 2025

(54) METHOD FOR PERFORMING LITHOGRAPHY PROCESS, LIGHT SOURCE, AND EUV LITHOGRAPHY SYSTEM

(71) Applicant: TAIWAN SEMICONDUCTOR MANUFACTURING COMPANY, LTD., Hsinchu (TW)

(72) Inventors: Chi Yang, Tainan (TW); Ssu-Yu Chen, New Taipei (TW); Shang-Chieh Chien, New Taipei (TW); Chieh Hsieh, Taoyuan (TW); Tzung-Chi Fu, Miaoli (TW); Bo-Tsun Liu, Taipei (TW); Li-Jui Chen, Hsinchu (TW); Po-Chung Cheng, Zhongpu Township, Chiayi County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/326,354

(22) Filed: May 31, 2023

(65) Prior Publication Data
US 2023/0324813 A1    Oct. 12, 2023

Related U.S. Application Data

(63) Continuation of application No. 17/745,234, filed on May 16, 2022, now Pat. No. 11,703,769, which is a
(Continued)

(51) Int. Cl.
*G03F 7/00* (2006.01)
*H05G 2/00* (2006.01)

(52) U.S. Cl.
CPC ...... *G03F 7/70891* (2013.01); *G03F 7/70025* (2013.01); *G03F 7/70033* (2013.01); *G03F 7/70533* (2013.01); *H05G 2/008* (2013.01)

(58) Field of Classification Search
CPC .... H05G 2/008; H05G 2/005; G03F 7/70025; G03F 7/70033; G03F 7/70533; G03F 7/70891
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |

(Continued)

FOREIGN PATENT DOCUMENTS

| | | |
|---|---|---|
| TW | 200612208 A | 4/2006 |
| WO | WO 2017/083569 A1 | 5/2017 |

*Primary Examiner* — Deoram Persaud
(74) *Attorney, Agent, or Firm* — Birch, Stewart, Kolasch & Birch, LLP

(57) ABSTRACT

A method for performing a lithography process is provided. The method includes forming a photoresist layer over a substrate, providing a plurality of target droplets to a source vessel, and providing a plurality of first laser pulses according to a control signal provided by a controller to irradiate the target droplets in the source vessel to generate plasma as an EUV radiation. The plasma is generated when the control signal indicates a temperature of the source vessel is within a temperature threshold value. The method further includes directing the EUV radiation from the source vessel to the photoresist layer to form a patterned photoresist layer and developing and etching the patterned photoresist layer to form a circuit layout.

20 Claims, 8 Drawing Sheets

Related U.S. Application Data continuation of application No. 17/077,410, filed on Oct. 22, 2020, now Pat. No. 11,333,983, which is a continuation of application No. 16/057,208, filed on Aug. 7, 2018, now Pat. No. 10,824,083.

(60) Provisional application No. 62/564,566, filed on Sep. 28, 2017.

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 10,524,345 B2 | 12/2019 | Chang et al. |
| 2009/0230326 A1 | 9/2009 | Vaschenko et al. |
| 2010/0176310 A1 | 7/2010 | Moriya et al. |
| 2012/0228526 A1 | 9/2012 | Vaschenko |
| 2012/0286176 A1 | 11/2012 | Rajyaguru et al. |
| 2013/0134326 A1 | 5/2013 | Yabu et al. |
| 2014/0203195 A1 | 7/2014 | Fleurov et al. |
| 2014/0284502 A1* | 9/2014 | Nakano ............. H01L 21/268 250/504 R |
| 2015/0062544 A1 | 3/2015 | Ershov |
| 2016/0041374 A1* | 2/2016 | Vanderhallen ..... G02B 19/0023 359/845 |
| 2016/0278195 A1 | 9/2016 | Kim et al. |
| 2016/0320708 A1 | 11/2016 | Lu et al. |
| 2017/0064801 A1* | 3/2017 | Lambert ............. B23K 26/702 |
| 2017/0142817 A1 | 5/2017 | Kuritsyn et al. |
| 2018/0288863 A1 | 10/2018 | Fujimaki et al. |
| 2019/0101831 A1 | 4/2019 | Chung et al. |
| 2019/0155157 A1 | 5/2019 | Chen et al. |
| 2020/0033731 A1 | 1/2020 | Takashima et al. |
| 2020/0178380 A1 | 6/2020 | Chen et al. |
| 2022/0404717 A1* | 12/2022 | Burdt ................. G03F 7/70516 |
| 2023/0038668 A1* | 2/2023 | Chen ..................... H05G 2/008 |
| 2023/0300966 A1* | 9/2023 | Kitasaka ............. H05G 2/008 250/504 R |

\* cited by examiner

METHOD FOR PERFORMING LITHOGRAPHY PROCESS, LIGHT SOURCE, AND EUV LITHOGRAPHY SYSTEM

CROSS REFERENCE TO RELATED APPLICATIONS

This application is a Continuation Application of U.S. patent application Ser. No. 17/745,234, filed on May 16, 2022, which is a Continuation Application of U.S. patent application Ser. No. 17/077,410, filed on Oct. 22, 2020, which is a Continuation Application of U.S. patent application Ser. No. 16/057,208, filed on Aug. 7, 2018, which claims priority of U.S. Provisional Application No. 62/564,566, filed on Sep. 28, 2017, the entirety of which are incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Extreme ultraviolet lithography (EUVL) has been developed to perform high-resolution photolithography in semiconductor manufacturing. The EUVL employs scanners using light in the extreme ultraviolet (EUV) region, having a wavelength of about 1-100 nm. Some EUV scanners provide 4×reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector and reflected by optics towards a lithography target, e.g., a wafer. The collector is subjected to damage and degradation due to the impact of particles, ions, radiation, and most seriously, tin deposition.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
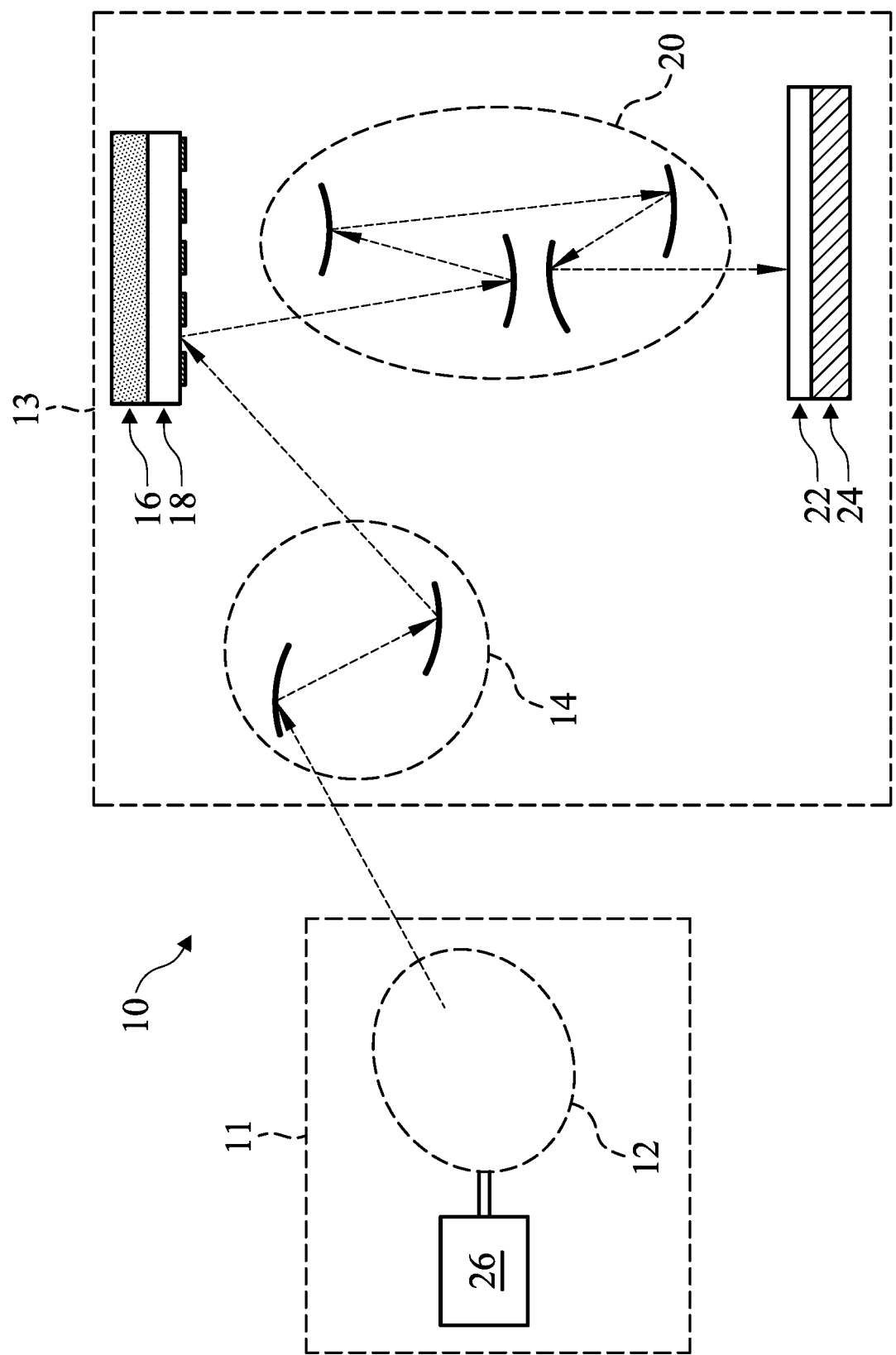
FIG. 1 shows a schematic and diagrammatic view of a lithography system, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 shows a schematic and diagrammatic view of a lithography system 10, in accordance with some embodiments of the disclosure. The lithography system 10 is operable to perform lithography exposing processes with respective radiation source and exposure mode.

The lithography system 10 includes a light source 12, an illuminator 14, a mask stage 16, a projection optics module (or projection optics box (POB)) 20, a substrate stage 24, and a gas supply module 26. In some embodiments, the light source 12 and the gas supply module 26 are implemented in an extreme ultraviolet (EUV) radiation source apparatus 11.

Furthermore, the illuminator 14, the mask stage 16, the projection optics module 20 and the substrate stage 24 are implemented in an EUV scanner 13. The elements of the lithography system 10 can be added to or omitted, and the invention should not be limited by the embodiment.

The light source 12 is configured to generate radiation having a wavelength ranging between about 1 nm and about 100 nm. In some embodiments, the light source 12 is capable of generating an EUV radiation (or light) with a wavelength centered at about 13.5 nm. In such embodiments, the light source 12 is also referred to as an EUV light source. In some embodiments, the light source 12 can be utilized to perform any high-intensity photon emission from excited target material.

The illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the light source 12 onto a mask stage 16, particularly to a mask 18 secured on the mask stage 16. In such embodiments, the light source 12 generates light in the EUV wavelength range, and reflective optics is employed.

The mask stage 16 is configured to secure the mask 18. In some embodiments, the mask stage 16 includes an electrostatic chuck (e-chuck) to secure the mask 18. This is because the gas molecules absorb EUV light and the lithography system for the EUV lithography patterning is maintained in a vacuum environment to avoid EUV intensity loss. In such embodiments, the terms mask, photomask, and reticle are used interchangeably.

In some embodiments, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or POB) 20 is configured to provide a patterned beam and project the patterned beam onto a semiconductor substrate 22, so as to image the pattern of the mask 18 on to the semiconductor substrate 22 secured on a substrate stage 24 of the lithography system 10. In some embodiments, the projection optics module 20 has refractive optics (such as for a UV lithography system) or alternatively reflective optics (such as for an EUV lithography system). The light directed from the mask 18, carrying the image of the pattern defined on the mask, is collected by the projection optics module 20. In some embodiments, the illumina-tor 14 and the projection optics module 20 are collectively referred to as an optical module of the lithography system 10.

The semiconductor substrate 22 is a semiconductor wafer, and the semiconductor wafer may be made of silicon or other semiconductor materials. Alternatively or additionally, the semiconductor substrate 22 may include other elementary semiconductor materials such as germanium (Ge). In some embodiments, the semiconductor substrate 22 is made of a compound semiconductor such as silicon carbide (SiC), gallium arsenic (GaAs), indium arsenide (InAs), or indium phosphide (InP). In some embodiments, the semiconductor substrate 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor substrate 22 may be a silicon-on-insulator (SOI) or a germanium-on-insulator (GOI) substrate.

The semiconductor substrate 22 may have various device elements. Examples of device elements that are formed in the semiconductor substrate 22 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor substrate 22 is coated with a resist layer sensitive to the EUV light. Various components including those described above are integrated together and are operable to perform lithography exposing processes.

The lithography system 10 may further include other modules or be integrated with (or be coupled with) other modules. For example, the gas supply module 26 is configured to provide hydrogen gas to the light source 12, so as to decrease contamination of the light source 12.

Figure 2:
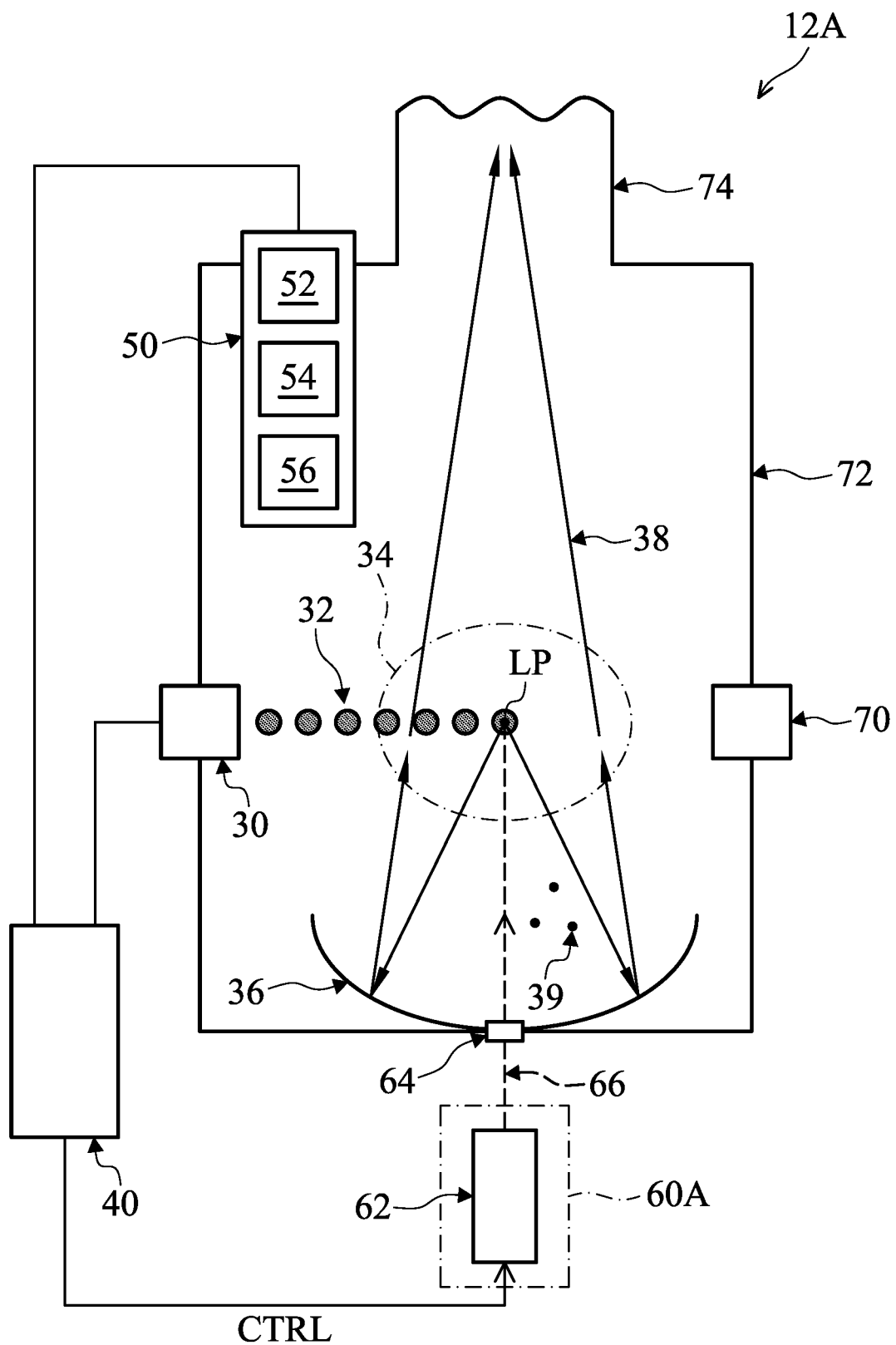
FIG. 2 shows a light source of the lithography system of FIG. 1, in accordance with some embodiments of the disclosure.

FIG. 2 shows a light source 12A of the lithography system 10 of FIG. 1, in accordance with some embodiments of the disclosure. The light source 12A employs a single pulse laser produced plasma (LPP) mechanism to generate plasma and further generate EUV light from the plasma.

In some embodiments, the light source 12A includes a controller 40, a target droplet generator 30, a laser generator 60A, a laser produced plasma (LPP) collector 36, a measuring device 50, a droplet catcher 70, and a source vessel (or chamber) 72. The above-mentioned elements of the light source 12A may be held under vacuum. Furthermore, the source vessel 72 is maintained in a vacuum environment. It should be appreciated that the elements of the light source 12A can be added to or omitted, and the invention should not be limited by the embodiments.

The controller 40 is coupled to the measuring device 50, the target droplet generator 30, and the laser generator 60A. The controller 40 is configured to control the operations of the measuring device 50, the target droplet generator 30, and the laser generator 60A. Furthermore, the controller 40 is configured to receive measuring information regarding condition variations (e.g., positions of the target droplets 32 and/or temperature TEMP) within the source vessel 72 from the measuring device 50.

The target droplet generator 30 is configured to generate a plurality of target droplets 32 into the source vessel 72. For example, the target droplets 32 are generated one at a time and a train of target droplets 32 move through the excitation zone 34. In some embodiments, the target droplet generator 30 includes a gas supplier (not shown). The gas supplier is configured to supply a pumping gas to force target material out of the target droplet generator 30 and drive the flowing of the target droplets 32. A flow velocity of the target droplets 32 from the target droplet generator 30 is controlled by the controller 40. Furthermore, the flow velocity of the target droplets 32 from the target droplet generator 30 is a function of the pressure of the pumping gas in the target droplet generator 30. For example, the target droplets 32 flow faster when the pressure of the pumping gas is increased, and the target droplets 32 flow slower when the pressure of the pumping gas is decreased.

In some embodiments, the target droplets 32 are tin (Sn) droplets. In some embodiments, the target droplets 32 have a diameter about 30 microns (μm). In some embodiments, the target droplets 32 are generated at a rate about 50 kilohertz (kHz) and are introduced into the excitation zone 34 in the light source 12A at a speed about 70 meters per second (m/s). Other material can also be used for the target droplets 32, for example, a tin containing liquid material such as eutectic alloy containing tin, lithium (Li), and xenon (Xe). The target droplets 32 may be in a solid or liquid phase.

The laser generator 60A is configured to generate a pulse laser 66 according to a control signal CTRL from the controller 40, to allow a conversion of the target droplets 32 into plasma. The laser generator 60A includes a laser source 62. In response to the control signal CTRL, the laser source 62 is configured to produce the pulse laser (or laser beam) 66. The pulse laser 66 is used to irradiate the target droplets 32, so as to generate increased emission of light. For example, the pulse laser 66 heats the target droplets 32 to a preset temperature. At the preset temperature, the material of the target droplets 32 shed their electrons and become a plasma that emits EUV light (or radiation) 38. The EUV light 38 is collected by the collector 36. The collector 36 further reflects and focuses the EUV light 38 for the lithography exposure processes. For example, the EUV light 38 collected by the collector 36 is irradiated to the illuminator 14 of FIG. 1 via an output port 74 of the source vessel 72, so as to direct the EUV light 38 from the light source 12 onto the mask stage 16, particularly to the mask 18 secured on the mask stage 16.

In such embodiments, the laser source 62 is a carbon dioxide ($CO_2$) laser source. In some embodiments, the laser source 62 is a neodymium-doped yttrium aluminum garnet (Nd:YAG) laser source. In some embodiments, the pulse laser 66 has a specific spot size (e.g., about 100-300 μm). The pulse laser 66 is generated to have certain driving powers to fulfill wafer volume production, such as a throughput of 125 wafers per hour. For example, the pulse laser 66 is equipped with about 19 kW driving power. It should be appreciated that many variations and modifications can be made to embodiments of the disclosure.

The pulse laser 66 from the laser source 62 is directed through a window (or lens) 64 of the collector 36, into the excitation zone 34, so as to irradiate the target droplets 32 in a lighting position LP (e.g., a focal point) of the excitation zone 34. The window 64 adopts a suitable material substantially transparent to the pulse laser 66.

The collector 36 is designed with the proper coating material and shape, functioning as a mirror for EUV collection, reflection, and focusing. In some embodiments, the collector 36 is designed to have an ellipsoidal geometry. In some embodiments, the coating material of the collector 36 is similar to the reflective multilayer of the EUV mask 18 of FIG. 1. In some embodiments, the coating material of the collector 36 includes a ML (such as a plurality of Mo/Si film pairs) and may further include a capping layer (such as Ru) coated on the ML to substantially reflect the EUV light. In some embodiments, the collector 36 may further include a grating structure designed to effectively scatter the laser beam directed onto the collector 36. For example, a silicon nitride layer may be coated on the collector 36 and patterned to have a grating structure.

The droplet catcher 70 is arranged opposite to the target droplet generator 30 and in the direction of the movement of the target droplets 32. The droplet catcher 70 is configured to catch any target droplets 32 that are not hit by the pulse laser 66. For example, some target droplets 32 may be purposely missed by the pulse laser 66. Furthermore, the high-temperature plasma may cool down and become vapor or small particles (collectively, debris) 39. When the target droplets 32 are not properly and accurately irradiated by the pulse laser 66 at the lighting position LP of the excitation zone 34, the debris 39 is increased. For example, if the target droplets 32 are unstable, the unstable target droplets 32 are converted into unstable plasma and unexpected debris 39 is present, thereby increasing the debris 39. The debris 39 may be deposited onto the surface of the collector 36, thereby causing contamination thereof. Over time, the reflectivity of the collector 36 degrades due to debris accumulation and other factors such as ion damages, oxidation, and blistering. Once the reflectivity is degraded to a certain degree (e.g., less than 50%), the collector 36 reaches the end of its usable lifespan and needs to be swapped out in a replacement operation. When swapping out the collector 36 during the replacement operation, the lithography system 10 is shut down, and no lithography exposing process can be performed. When the number of the replacement operations or operation time of the replacement operations is increased, manufacturing cycle of the semiconductor substrate 22 is increased, thereby increasing manufacturing costs.

The measuring device 50 includes a thermal sensor 52 and a droplet detector 54 in certain embodiments. The thermal sensor 52 is configured to measure temperature TEMP within the source vessel 72, and to provide the temperature TEMP to the controller 40. In some embodiments, the thermal sensor 52 is a thermograph arranged in the source vessel 72.

The droplet detector 54 is configured to measure the droplet positions of the target droplets 32, and to provide information regarding the droplet positions to the controller 40. In some embodiments, the droplet detector 54 is a droplet imager including a camera (not shown) capable of capturing images of the target droplets 32. According to the images of the target droplets 32, the droplet imager provides information regarding the droplet positions of the target droplets 32 to the controller 40. In some embodiments, the droplet detector 54 is a droplet imager including a light generator (not shown) and a light detector (not shown). The light generator is configured to direct a laser beam to the target droplets 32. In some embodiments, the light detector, such as a photodetector array, avalanche photodiode or photomultiplier, is arranged opposite the light generator, and is configured to receive the laser beam passing through the target droplets 32, so as to obtain the droplet positions of the target droplets 32. In some embodiments, the light detector is arranged adjacent to the light generator, and is configured to receive the laser beam reflecting from the target droplets 32, so as to obtain the droplet positions of the target droplets 32. Furthermore, the droplet positions may be determined in one or more axes.

In some embodiments, the measuring device 50 further includes a laser meter 56 for measuring a beam size of the pulse laser 66 and providing the measured beam size to the controller 40. Furthermore, the installation position of the laser meter 56 within the source vessel 72 is determined according to various applications. In some embodiments, the laser meter 56 is capable of measuring the lighting position LP and providing the measured lighting position LP to the controller 40, so as to detect whether the lighting position LP is offset.

In the light source 12A, according to the temperature TEMP of the source vessel 72 and the droplet positions of the target droplets 32 from the measuring device 50, the controller 40 is capable of providing the control signal CTRL to the laser generator 60A, so as to control whether to generate the pulse laser 66. For example, when the temperature TEMP of the source vessel 72 or the droplet positions of the target droplets 32 are normal, the controller 40 determines that the target droplets 32 are stable, and the controller 40 is configured to provide the control signal CTRL to the laser generator 60A, so as to provide the pulse laser 66. Conversely, when the temperature TEMP of the source vessel 72 and/or the droplet position of the target droplet 32 are abnormal, the controller 40 determines that the target droplets 32 are unstable, and the controller 40 is configured to provide the control signal CTRL to the laser generator 60A, so as to stop providing the pulse laser 66 until the temperature TEMP of the source vessel 72 or the droplet position of the target droplet 32 is normal. Therefore, converting the unstable target droplets 32 with the pulse laser 66 is avoided, thereby reducing contamination on the surface of the collector 36 and extending the usable lifespan of the collector 36. A detailed description of the operation will be provided below.

In some embodiments, in addition to the temperature TEMP of the source vessel 72 and the droplet positions of the target droplets 32 from the measuring device 50, the controller 40 is configured to provide the control signal CTRL further according to the beam size of the pulse laser 66 and the lighting position LP measured by the laser meter 56. For example, when the beam size of the pulse laser 66 or the lighting position LP are normal, the controller 40 is configured to provide the control signal CTRL to the laser generator 60A, so as to provide the pulse laser 66. Conversely, when the beam size of the pulse laser 66 and/or the lighting position LP are abnormal, the controller 40 is configured to provide the control signal CTRL to the laser generator 60A, so as to stop providing the pulse laser 66 until the beam size of the pulse laser 66 or the lighting position LP is normal. Therefore, converting the target droplets 32 with the unstable pulse laser 66 is avoided, thereby reducing contamination on the surface of the collector 36 and extending the usable lifespan of the collector 36.

In some embodiments, the controller 40 further provides the control signal CTRL to the EUV scanner 13 of FIG. 1, so as to notify the EUV scanner 13 whether to suspend a lithography exposing process. For example, when the temperature TEMP of the source vessel 72 or the droplet positions of the target droplets 32 are normal, the controller 40 determines that the target droplets 32 are stable and provides the control signal CTRL to the EUV scanner 13, so as to perform the lithography exposing process. Conversely, when the temperature TEMP of the source vessel 72 and the droplet positions of the target droplets 32 are abnormal, the controller 40 determines that the target droplets 32 are unstable and provides the control signal CTRL to the EUV scanner 13, so as to suspend the lithography exposing process.

Figure 3:
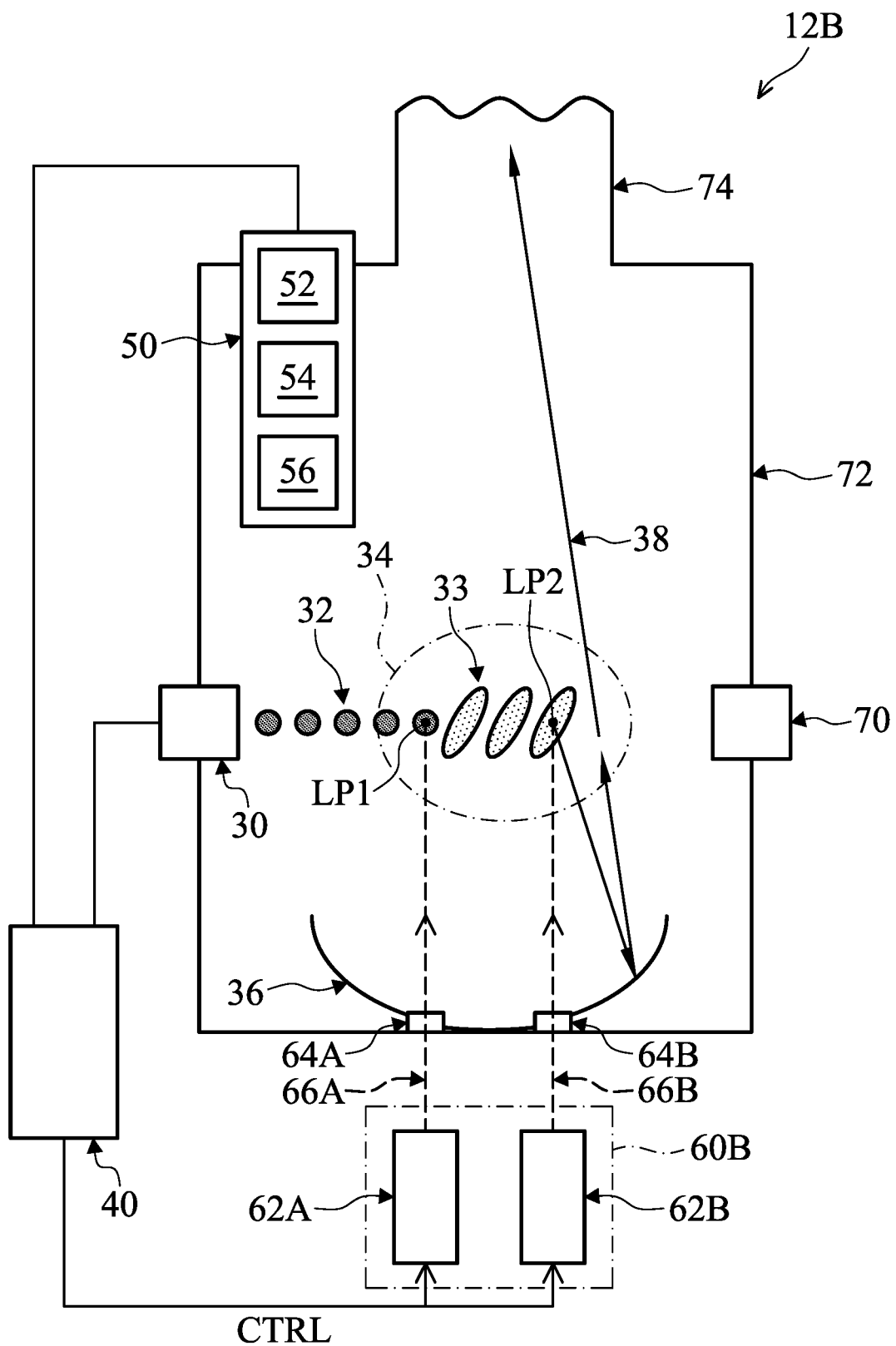
FIG. 3 shows a light source of the lithography system of FIG. 1, in accordance with some embodiments of the disclosure.

FIG. 3 shows a light source 12B of the lithography system 10 of FIG. 1, in accordance with some embodiments of the disclosure. The light source 12B employs a dual-pulse laser LPP mechanism to generate plasma and further generate EUV light from the plasma.

Compared with the laser generator 60A of the light source 12A in FIG. 2, the laser generator 60B of the light source 12B in FIG. 3 includes a first laser source 62A and a second laser source 62B. The first laser source 62A is configured to produce a pre-pulse laser 66A. The second laser source 62B is configured to produce a main pulse laser 66B. The pre-pulse laser 66A is used to heat (or pre-heat) the target droplets 32 to expand the target droplets 32 and create a low-density target plume 33, which is subsequently irradiated by the main pulse laser 66B, generating increased emission of light.

In some embodiments, the first laser source 62A is a carbon dioxide ($CO_2$) laser source. In some embodiments, the first laser source 62A is a neodymium-doped yttrium aluminum garnet (Nd:YAG) laser source. In some embodiments, the second laser source 62B is a $CO_2$ laser source.

In such embodiments, the pre-pulse laser 66A has less intensity and a smaller spot size than the main pulse laser 66B. In some embodiments, the pre-pulse laser 66A has a spot size of about 100 μm or less, and the main pulse laser 66B has a spot size about 200-300 μm (e.g., 225 μm). The pre-pulse laser 66A and the main pulse laser 66B are generated to have certain driving powers to fulfill wafer volume production, such as a throughput of 125 wafers per hour. For example, the pre-pulse laser 66A is equipped with about 2 kilowatts (kW) driving power, and the main pulse laser 66B is equipped with about 19 kW driving power. In some embodiments, the total driving power of the pre-pulse laser 66A and the main pulse laser 66B, is at least 20 kW, such as 27 kW. However, it should be appreciated that many variations and modifications can be made to embodiments of the disclosure.

The pre-pulse laser 66A from the first laser source 62A and the main pulse laser 66B from the second laser source 62B are directed through the windows (or lenses) 64A and 64B of the collector 36, respectively, into the excitation zone 34 and irradiate the target droplets 32 at a first lighting position LP1 and a second lighting position LP2. In other words, the first lighting position LP1 and the second lighting position LP2 are the focal points of the pre-pulse laser 66A and main pulse laser 66B, respectively. The windows 64A and 64B may adopt a suitable material substantially transparent to the pre-pulse laser 66A and the main pulse laser 66B. In some embodiments, the generation of the pre-pulse laser 66A and main pulse laser 66B are synchronized with the generation of the target droplets 32. When the target droplets 32 move through the excitation zone 34, the pre-pulses 66A heat the target droplets 32 at the first lighting position LP1 and convert them into low-density target plumes 33. A delay between the pre-pulse laser 66A and main pulse laser 66B is controlled by the controller 40, to allow the target plume 33 to form and to expand to an optimal size and geometry. When the main pulse laser 66B heats the target plume 33 at the second lighting position LP2, a high-temperature plasma is generated. The plasma emits EUV radiation 38, which is collected by the collector 36. The collector 36 further reflects and focuses the EUV radiation 38 for the lithography exposing processes.

As described above, the droplet catcher 70 is arranged opposite the target droplet generator 30. The droplet catcher is configured to catch excessive target droplets 32. For example, some target droplets 32 may be purposely missed by both pre-pulse laser 66A and the main pulse laser 66B, or some target plume 33 may be purposely missed by only the main pulse laser 66B. Furthermore, when the target droplets 32 are not properly and accurately irradiated by the pre-pulse laser 66A, the debris 39 is increased. Similarly, when the target plume 33 is not properly and accurately irradiated by the main pulse laser 66B, the debris 39 is increased. For example, if the target droplets 32 are unstable, the unstable target droplets 32 are converted into unstable plasma, and unexpected debris 39 is present, thereby increasing the debris 39. The debris 39 may be deposited onto the surface of the collector 36, thereby causing contamination thereof. Thus, the reflectivity of the collector 36 is degraded and needs to be swapped out.

In the light source 12B, according to the temperature TEMP of the source vessel 72 and the droplet positions of the target droplets 32 measured by the measuring device 50, the controller 40 is capable of providing the control signal CTRL to the laser generator 60B, so as to control whether to generate the pre-pulse laser 66A and/or the main pulse laser 66B. For example, when the temperature TEMP of the source vessel 72 or the droplet position of the target droplet 32 are normal, the controller 40 determines that the target droplets 32 are stable, and the controller 40 provides the control signal CTRL to the laser generator 60B, so as to provide the pre-pulse laser 66A and the main pulse laser 66B. Conversely, when both the temperature TEMP of the source vessel 72 and the droplet position of the target droplet 32 are abnormal, the controller 40 determines that the target droplets 32 are unstable, and the controller 40 provides the control signal CTRL to the laser generator 60B, so as to stop providing the pre-pulse laser 66A and the main pulse laser 66B until the temperature TEMP of the source vessel 72 or the droplet position of the target droplet 32 is normal. Therefore, converting the unstable target droplets 32 with the pre-pulse laser 66A and/or the main pulse laser 66B is avoided, thereby reducing contamination on the surface of the collector 36 and extending usable lifespan of the collector 36. The details of the operation will be described below.

In some embodiments, in addition to the temperature TEMP of the source vessel 72 and the droplet positions of the target droplets 32 from the measuring device 50, the controller 40 is configured to provide the control signal CTRL further according to the beam sizes of the pre-pulse laser 66A and main pulse laser 66B and the first and second lighting positions LP1 and LP2 measured by the laser meter 56. For example, when the beam size of the pre-pulse laser 66A and/or the main pulse laser 66B, or the lighting positions LP1 and/or LP2 are normal, the controller 40 provides the control signal CTRL to the laser generator 60B, so as to provide the pre-pulse laser 66A and the main pulse laser 66B. Conversely, when the beam size of the pre-pulse laser 66A and/or the main pulse laser 66B, and the lighting positions LP1 and/or LP2 are abnormal, the controller 40 provides the control signal CTRL to the laser generator 60B, so as to stop providing the pre-pulse laser 66A and the main pulse laser 66B until the beam size of the pre-pulse laser 66A and/or the main pulse laser 66B, or the lighting positions LP1 and/or LP2 is normal. Therefore, converting the target droplets 32 with the unstable pre-pulse laser 66A and/or the main pulse laser 66B is avoided, thereby reducing contamination on the surface of the collector 36 and extending usable lifespan of the collector 36. The details of the operation will be described below.

In some embodiments, the controller 40 further provides the control signal CTRL to the EUV scanner 13 of FIG. 1, so as to notify the EUV scanner 13 whether to suspend a lithography exposing process. For example, when determining that the target droplets 32 are stable, the controller 40 is configured to provide the control signal CTRL to the EUV scanner 13, so as to perform the lithography exposing process. Conversely, when determining that the target droplets 32 are unstable, the controller 40 is configured to provide the control signal CTRL to the EUV scanner 13, so as to suspend the lithography exposing process.

Figure 4:
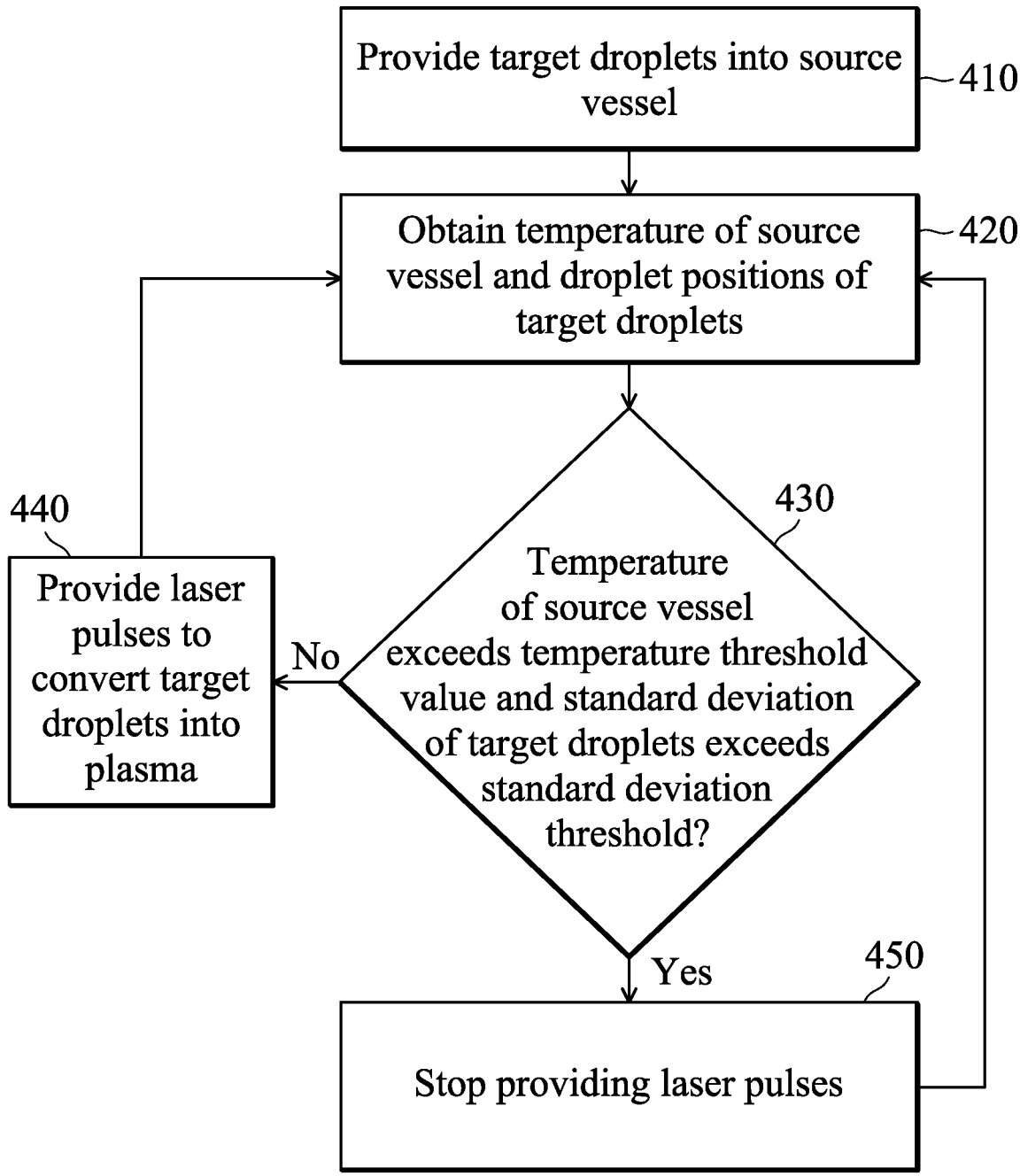
FIG. 4 shows a simplified flowchart of a method for generating extreme ultraviolet (EUV) radiation, in accordance with some embodiments of the disclosure.

FIG. 4 shows a simplified flowchart of a method for generating extreme ultraviolet (EUV) radiation, in accordance with some embodiments of the disclosure. Furthermore, the method of FIG. 4 is performed by the lithography system 10 of FIG. 1 for a lithography exposure process.

Before the method of FIG. 4 is performed, the EUV mask 18 is loaded to the lithography system 10 that is configured to perform an EUV lithography exposing process. The mask 18 is a patterning mask and includes an IC pattern to be transferred to a semiconductor substrate, such as the wafer 22. Furthermore, the mask 18 is secured on the mask stage 16 and an alignment of the mask 18 is performed.

Similarly, the semiconductor substrate 22 is loaded to the lithography system 10 before the method of FIG. 4 is performed. The wafer 22 is coated with a resist layer. In such embodiments, the resist layer is sensitive to the EUV light (radiation) from the light source 12 of the lithography system 10.

In operation 410 of FIG. 4, the target droplet generator 30 is configured to provide (or generate) the target droplets 32 into the source vessel 72 with the proper material, proper size, proper rate, and proper movement speed and direction. In some embodiments, the rate and the proper movement speed and/or direction of the target droplets 32 are controlled by the controller 40 according to a predetermined setting. As described above, the target droplets 32 are generated one at a time and a train of target droplets 32 move through the excitation zone 34 of the source vessel 72.

In operation 420 of FIG. 4, the temperature TEMP within the source vessel 72 is measured by the measuring device 50, and then the measuring device 50 is configured to provide the temperature TEMP to the controller 40. In some embodiments, the temperature TEMP is transmitted through an analog signal or a digital signal with one or multiple bits from the measuring device 50 to the controller 40.

Figure 5:
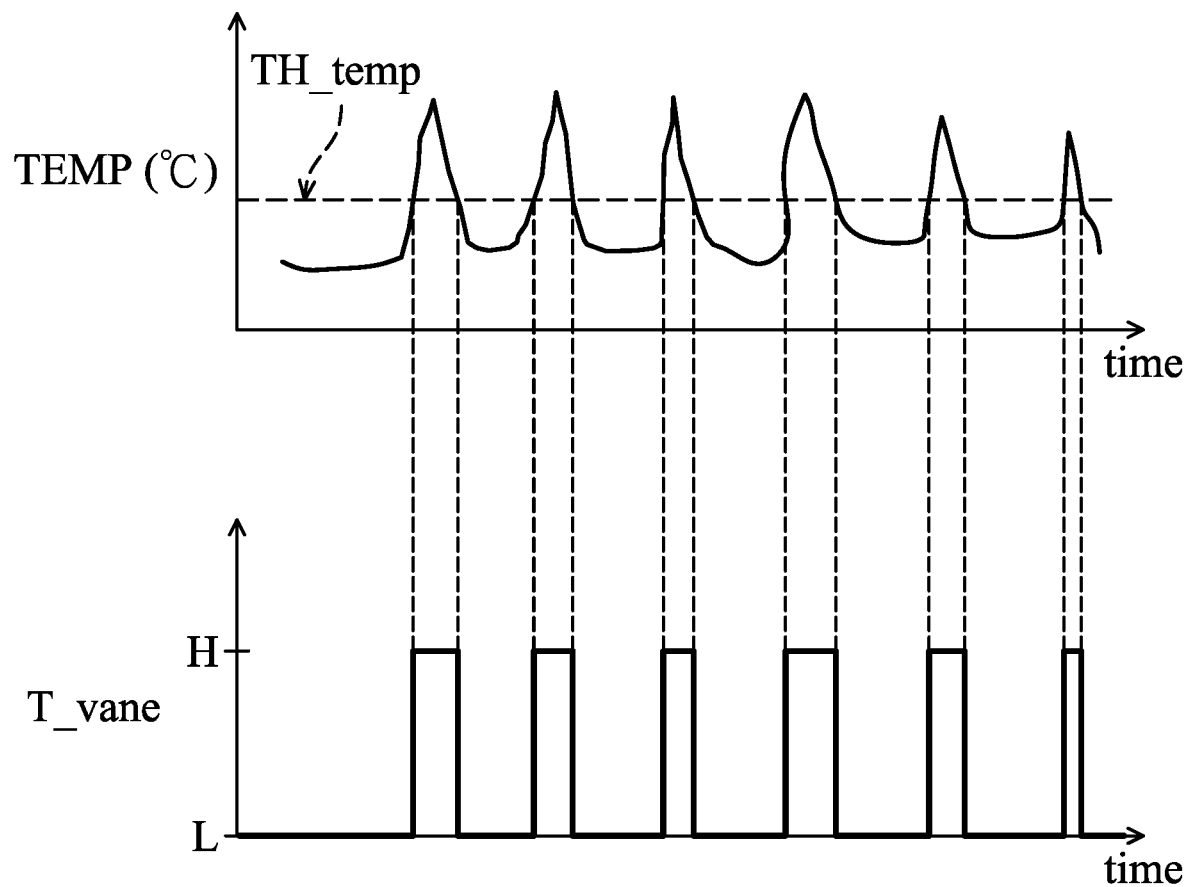
FIG. 5 shows an example illustrating the relationship between the temperature TEMP and the data T_vane, in accordance with some embodiments of the disclosure.

When obtaining the temperature TEMP, the controller 40 compares the temperature TEMP with a temperature threshold value TH_temp to obtain data (or a signal) T_vane, and the data T_vane is used to determine whether the temperature TEMP of the source vessel 72 is greater than the temperature threshold value TH_temp. Referring to FIG. 5, FIG. 5 shows an example illustrating the relationship between the temperature TEMP and the data T_vane, in accordance with some embodiments of the disclosure. In FIG. 5, when the temperature TEMP is less than or equal to the temperature threshold value TH_temp, the controller 40 obtains the data T_vane with a low logic level ("L"). Conversely, when the temperature TEMP is greater than the temperature threshold value TH_temp, the controller 40 obtains the data T_vane with a high logic level ("H").

In some embodiments, the controller 40 compares the temperature TEMP with a temperature range to obtain the data T_vane, and the data T_vane is used to determine whether the temperature TEMP of the source vessel 72 is greater than an upper temperature threshold value or less than a lower temperature threshold value (e.g., outside the temperature range). For example, when the temperature TEMP is within the temperature range (i.e., less than the upper temperature threshold value and greater than the lower temperature threshold value), the controller 40 obtains the data T_vane with a low logic level ("L"). Conversely, when the temperature TEMP does not fall within the temperature range (i.e., greater than the upper temperature threshold value or less than the lower temperature threshold value), the controller 40 obtains the data T_vane with a high logic level ("H").

Referring back to the flowchart of FIG. 4, in operation 420 of FIG. 4, droplet position of each target droplet 32 is also measured by the measuring device 50 and information regarding the droplet positions is provided to the controller 40. In some embodiments, the information regarding each droplet position is transmitted through an analog signal or a digital signal with one or multiple bits.

When obtaining the droplet positions, the controller 40 may calculate a standard deviation σ of the droplet positions in some embodiments, e.g., the controller 40 is configured to perform an arithmetic calculation on the standard deviation σ. In such embodiments, the standard deviation σ of the droplet positions is a measure that is used to quantify the amount of variation or dispersion of a set of the droplet positions. In other words, the standard deviation σ is a performance indicator for the interval between two consecutive target droplets 32. In some embodiments, the standard deviation σ is provided by the measuring device 50. In some embodiments, other calculations may be made to determine whether droplet pointing is acceptable.

In some embodiments, the standard deviation σ is obtained according to the following equation:

$$\sigma = \sqrt{\frac{1}{N}\sum_{i=1}^{N}(x_i - \mu)^2},$$

where $\{x_1, x_2, \ldots, x_N\}$ represent the droplet positions of first, second, ..., $N^{th}$ target droplets 32, N is the number of the target droplets 32, and μ represents the mean value of the droplet positions.

Figure 6:
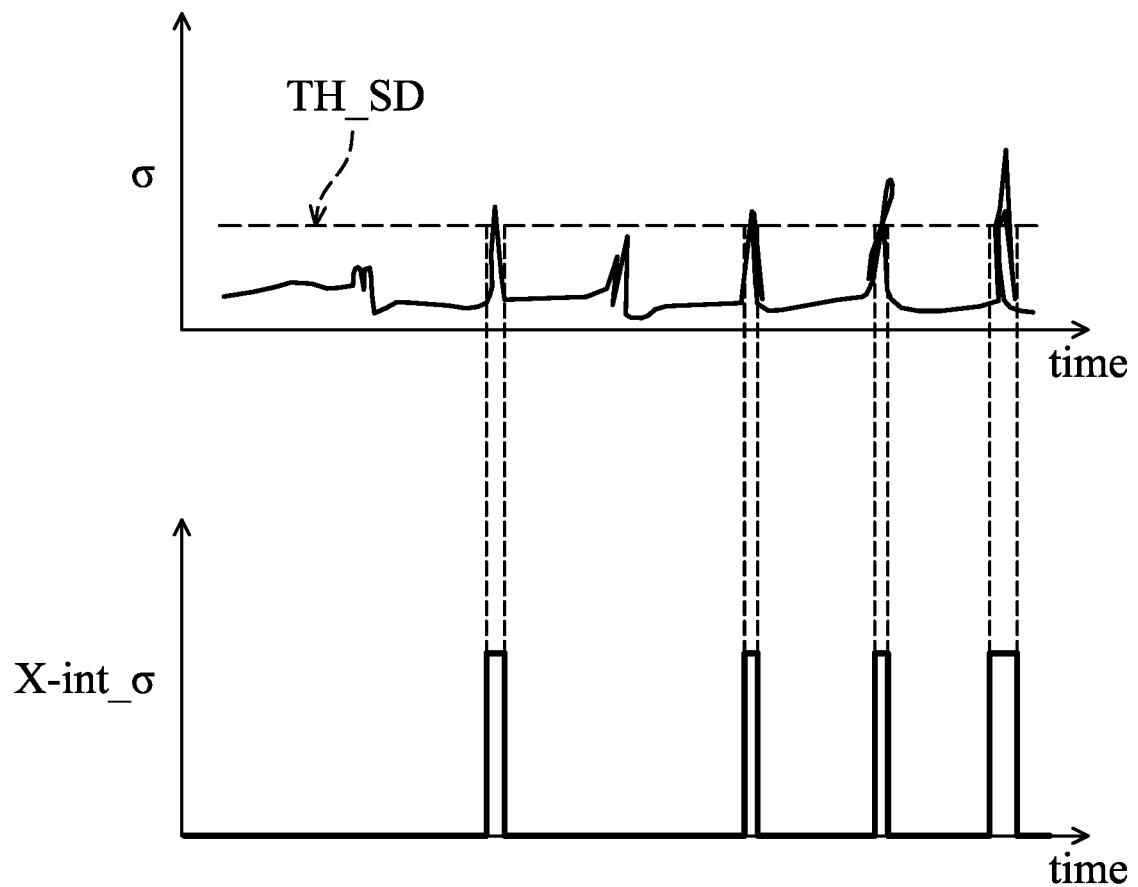
FIG. 6 shows an example illustrating the relationship between the standard deviation σ and the data X-int_σ, in accordance with some embodiments of the disclosure.

When obtaining the standard deviation σ, the controller 40 compares the standard deviation σ with a standard deviation threshold value TH_SD to obtain data (or a signal) X-int_σ, and the data X-int_σ is used to indicate whether the standard deviation σ of the target droplets 32 is greater than the standard deviation threshold value TH_SD. Referring to FIG. 6, FIG. 6 shows an example illustrating the relationship between the standard deviation σ and the data X-int_σ, in accordance with some embodiments of the disclosure. In FIG. 6, when the standard deviation σ is less than or equal to the standard deviation threshold value TH_SD, the controller 40 obtains the data X-int_σ with a low logic level ("L"). Conversely, when the standard deviation a is greater than the standard deviation threshold value TH_SD, the controller 40 obtains the data X-int_σ with a high logic level ("H").

In some embodiments, the controller 40 compares the standard deviation σ with a standard deviation range to obtain the data X-int_σ, and the data X-int_σ is used to indicate whether the standard deviation σ of the target droplets 32 is greater than an upper standard deviation threshold value or less than a lower standard deviation threshold value (e.g., outside the standard deviation range). For example, when the standard deviation σ is within the standard deviation range, the controller 40 obtains the data X-int_σ with a low logic level ("L"). Conversely, when the standard deviation σ does not fall within the standard deviation range (i.e., greater than the upper standard deviation threshold value or less than the lower standard deviation threshold value), the controller 40 obtains the data X-int_σ with a high logic level ("H").

Figure 7:
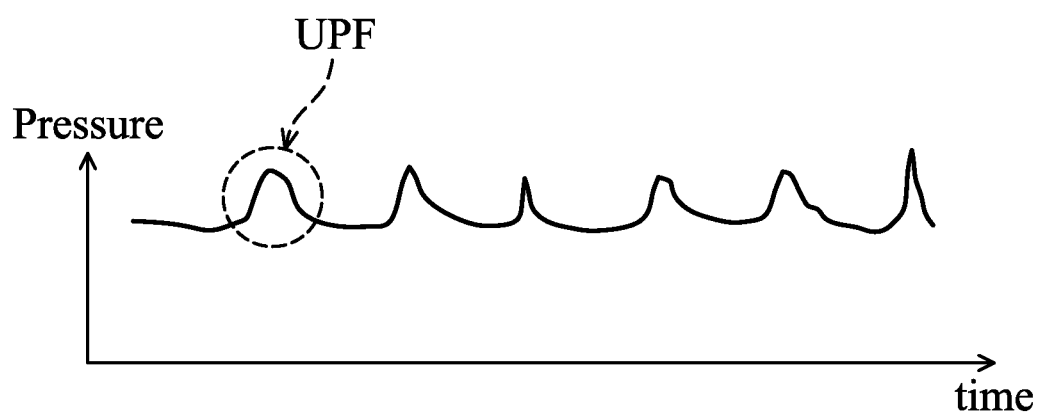
FIG. 7 shows a pressure of the source vessel corresponding to the temperature TEMP of FIG. 5 and the standard deviation σ of FIG. 6, in accordance with some embodiments of the disclosure.

Due to the standard deviation σ being sensitive to the vessel conditions of the source vessel 72, such as the temperature TEMP, when the source vessel 72 is heated, the variation of the temperature TEMP leads to unstable pressure flow, thereby impacting the droplet positions of the target droplets 32. For example, referring to FIG. 7, FIG. 7 shows a pressure of the source vessel 72 corresponding to the temperature TEMP of FIG. 5 and the standard deviation σ of FIG. 6, in accordance with some embodiments of the disclosure. When an obvious variation (labeled as UPF) is present in the pressure of the source vessel 72, the pressure variation will cause the unstable pressure flow to impact the target droplets 32, thereby generating unstable target droplets 32. In FIG. 7, the obvious variation (labeled as UPF) of the pressure of the source vessel 72 is caused by the obvious variation in the temperature TEMP of FIG. 5.

Referring back to the flowchart of FIG. 4, in operation 430, the controller 40 determines whether the temperature TEMP exceeds the temperature threshold value TH_temp and whether the standard deviation σ exceeds the standard deviation threshold TH_SD. When determining that the temperature TEMP does not exceed the temperature threshold value TH_temp (e.g., TEMP≤TH_temp) or the standard deviation σ does not exceed the standard deviation threshold TH_SD (e.g., σ≤TH_SD), the controller 40 is configured to provide the control signal CTRL to the laser generator (e.g., 60A of FIG. 2 or 60B of FIG. 3) for notifying that the target droplets 32 are stable. Thus, the laser generator continues to provide the pulse laser 66.

As described above, the standard deviation σ is a process parameter (or an indicator) to quantify the amount of variation or dispersion of a set of the droplet positions. In some embodiments, other process parameters may be used to quantify the amount of variation or dispersion of the droplet positions, such as an average value (or a mean value) of the droplet positions or a first derivatives of the droplet positions by time. For example, the controller 40 determines whether the temperature TEMP exceeds the temperature threshold value TH_temp and whether the average value is within a predetermined range. When determining that the temperature TEMP does not exceed the temperature threshold value TH_temp (e.g., TEMP≤TH_temp) or the average value does not exceed the predetermined range, the controller 40 is configured to provide the control signal CTRL to the laser generator (e.g., 60A of FIG. 2 or 60B of FIG. 3) for notifying that the target droplets 32 are stable. Thus, the laser generator continues to provide the pulse laser 66.

In operation 440, in response to the control signal CTRL, the laser generator is configured to provide the laser pulses (e.g., 66 of FIG. 2 or 66A and 66B of FIG. 3), so as to convert the target droplets 32 into plasma as the EUV radiation for the lithography exposing process. For example, if the control signal CTRL indicates that the target droplets 32 are stable, the laser source 62 is configured to produce the pulse laser 66 in FIG. 2. Similarly, the laser source 62A is configured to produce the pre-pulse laser 66A, and the laser source 62B is configured to produce the main pulse laser 66B in FIG. 3.

For the EUV scanner 13 of FIG. 1, the controller 40 further provides the control signal CTRL to the EUV scanner 13, so as to notify the EUV scanner 13 to continue the lithography exposing process. Furthermore, the EUV radiation generated by the light source 12 is illuminated on the mask 18 (by the illuminator 14), and is further projected on the resist layer coated on the wafer 22 (by the projection optics module 20), thereby forming a latent image on the resist layer.

When the laser pulses are generated by the laser generator in response to the control signal CTRL (in operation 440), the operation 420 of the flowchart in FIG. 4 is performed again, so as to obtain the current temperature TEMP and the current droplet positions. Thus, the temperature TEMP and the standard deviation σ are updated. Next, when the controller 40 determines that the temperature TEMP does not exceed the temperature threshold value TH_temp or determines that the standard deviation σ does not exceed the standard deviation threshold TH_SD (in operation 430), the controller 40 continues to provide the control signal CTRL for generating the laser pulses (in operation 440).

Conversely, when the controller 40 simultaneously determines that the temperature TEMP exceeds the temperature threshold value TH_temp and the standard deviation σ exceeds the standard deviation threshold TH_SD (in operation 430), the controller 40 determines that the target droplets 32 are unstable, and provides the control signal CTRL to the laser generator (e.g., 60A of FIG. 2 or 60B of FIG. 3), so as to stop providing the pulse lasers (e.g., 66 of FIG. 2 or 66A and 66B of FIG. 3) in operation 450 until the temperature TEMP does not exceed the temperature threshold value TH_temp or the standard deviation σ does not exceed the standard deviation threshold TH_SD. For example, if the control signal CTRL indicates that the target droplets 32 are unstable, the laser source 62 is configured to stop producing the pulse laser 66 in FIG. 2. In some embodiments, if the control signal CTRL indicates that the target droplets 32 are unstable, only the laser source 62B is configured to stop producing the main pulse laser 66B in FIG. 3. In some embodiments, if the control signal CTRL indicates that the target droplets 32 are unstable, both the laser sources 62A and 62B are configured to stop producing the pre-pulse laser 66A and the main pulse laser 66B in FIG. 3.

When the target droplets 32 are unstable, the controller 40 further provides the control signal CTRL to the EUV scanner 13 of FIG. 1, so as to notify the EUV scanner 13 to suspend the lithography exposing process. Furthermore, when the laser pulses are not generated by the laser generator in response to the control signal CTRL, the operation 420 of the flowchart in FIG. 4 is performed again, so as to obtain the current temperature TEMP and the current droplet positions. Thus, the temperature TEMP and the standard deviation σ are updated. Next, in operation 430, the controller 40 determines whether the current temperature TEMP exceeds the temperature threshold value TH_temp and determines whether the current standard deviation σ exceeds the standard deviation threshold TH_SD, and then subsequent operation (e.g., operation 440 or 450 of FIG. 4) is performed in response to the control signal CTRL corresponding to the determination in operation 430.

Figure 8:
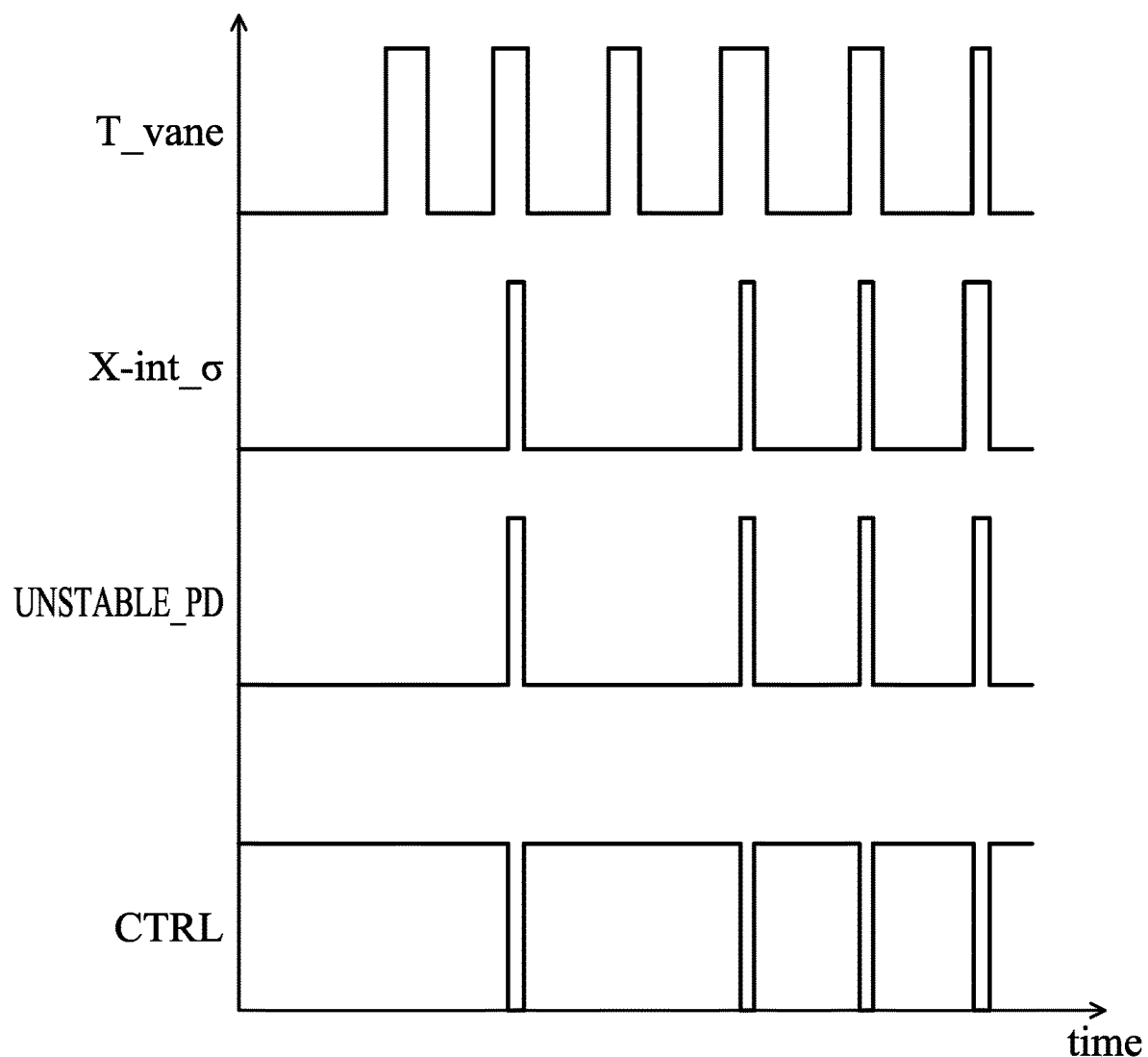
FIG. 8 shows an example illustrating the control signal CTRL corresponding to the determination in operation 430 according to the temperature TEMP of FIG. 5 and the standard deviation σ of FIG. 6, in accordance with some embodiments of the disclosure.

FIG. 8 shows an example illustrating the control signal CTRL corresponding to the determination in operation 430 according to the temperature TEMP of FIG. 5 and the standard deviation σ of FIG. 6, in accordance with some embodiments of the disclosure. As described above, when the temperature TEMP exceeds the temperature threshold value TH_temp, the controller 40 obtains the data T_vane with a high logic level. Furthermore, when the standard deviation σ exceeds the standard deviation threshold value TH_SD, the controller 40 obtains the data X-int_σ with a high logic level. The controller 40 performs an AND logic operation on the data T_vane and the data X-int_σ to obtain data (or signal) UNSTABLE_PD. In such embodiments, the data UNSTABLE_PD is obtained according to the convolution of the data T_vane and the data X-int_σ, and the data UNSTABLE_PD is used to represent the status of the target droplets 32 in the source vessel 72. For example, if both the data T_vane and the data X-int_σ are at a high logic level, the data UNSTABLE_PD is at a high logic level, which represents that the target droplets 32 are unstable. If the data T_vane or the data X-int_σ is at a low logic level, the data UNSTABLE_PD is at a low logic level, which represents that the target droplets 32 are stable.

In such embodiments, the controller 40 provides the control signal CTRL according to the data UNSTABLE_PD, and the data UNSTABLE_PD is obtained according to the process parameters regarding to the temperature TEMP and the standard deviation σ. In such embodiments, the control signal CTRL is complement to the data UNSTABLE_PD. Therefore, when the control signal CTRL is at a high logic level (i.e., the target droplets 32 are stable), the laser generator is configured to provide the laser pulses in response to the control signal CTRL with a high logic level. Conversely, when the control signal CTRL is at a low logic level (i.e., the target droplets 32 are unstable), the laser generator is configured to stop providing the laser pulses in response to the control signal CTRL with a low logic level.

In some embodiments, other process parameters regarding to the droplet positions of the target droplets 32 may be used to obtain the data UNSTABLE_PD. For example, assuming that the number of the target droplets 32 is N, the other process parameter may be the average value of the droplet positions of first, second, . . . , $N^{th}$ target droplets 32, or the first derivatives of the droplet positions of first, second, . . . , $N^{th}$ target droplets 32 by time.

In some embodiments, the process parameters regarding to the beam sizes of the pulse laser 66, the pre-pulse laser 66A and/or the main pulse laser 66B may be used to obtain the data UNSTABLE_PD. For example, the process parameter may be the average value or the standard deviation of beam sizes of the pulse lasers 66 (or the pre-pulse laser 66A, the main pulse laser 66B) corresponding to first, second, . . . , $N^{th}$ target droplets 32.

In some embodiments, the process parameters regarding to the focal points of the pulse laser 66, the pre-pulse laser 66A and/or the main pulse laser 66B may be used to obtain the data UNSTABLE_PD. For example, the process parameter may be the average value, the standard deviation or the first derivatives of the focal points of the pulse laser 66 (or the pre-pulse laser 66A, the main pulse laser 66B) corresponding to first, second, . . . , $N^{th}$ target droplets 32. Furthermore, the process parameter may be the average value, the standard deviation or the first derivatives of the focal point separation between the pre-pulse laser 66A and the main pulse laser 66B corresponding to first, second, . . . , $N^{th}$ target droplets 32. In some embodiments, the focal point separation between the pre-pulse laser 66A and the main pulse laser 66B represent a difference between the first lighting position LP1 and the second lighting position LP2 of FIG. 3.

In some embodiments, two or more process parameters previously described are used to obtained the data UNSTABLE_PD according to various processes or applications. For example, in FIG. 8, the data UNSTABLE_PD is obtained according to the process parameter regarding to the temperature TEMP of FIG. 5 and the process parameter regarding to the standard deviation σ of FIG. 6.

In some embodiments, if two of more process parameters used to obtained the data UNSTABLE_PD are outside the corresponding ranges (e.g., the temperature range or the standard deviation range) or are greater than the corresponding threshold values (e.g., the temperature threshold value TH_temp or the standard deviation threshold value TH_SD), the controller 40 determines that the target droplets 32 or the laser pulses 66/66A/66B are unstable, and no pulse lasers are generated to irradiate the target droplets 32 in the source vessel 72. Conversely, if one of the process parameters used to obtained the data UNSTABLE_PD is within the corresponding ranges or are less than or equal to the corresponding threshold values, the controller 40 determines that the target droplets 32 or the laser pulses 66/66A/66B are stable, and the controller 40 is configured to provide the control signal CTRL to the laser generator 60A/60B, so as to provide the pulse laser 66/66A/66B.

In some embodiments, the control signal CTRL is a gating signal for suspending the lithography exposing process. As described above, the controller 40 further provides the control signal CTRL to notify the EUV scanner 13 whether to suspend the lithography exposing process. For example, when the control signal CTRL is at a high logic level (i.e., the target droplets 32 are stable), the EUV scanner 13 is configured to perform the lithography exposing process in response to the control signal CTRL with a high logic level. Conversely, when the control signal CTRL is at a low logic level (i.e., the target droplets 32 are unstable), the EUV scanner 13 is configured to suspend the lithography exposing process in response to the control signal CTRL with a low logic level, thereby preventing the unexpected debris 39 generation. Therefore, the usable lifespan of the collector 36 is increased. For example, the usable lifespan is increased from 30 days to 180 days. It should be appreciated that the logic levels of the data T_vane, X-int_σ, and UNSTABLE_PD and the control signal CTRL can be changed, and the invention should not be limited by the embodiments.

Embodiments for light source, EUV lithography system, and method for generating EUV radiation are provided. A target droplet generator 30 is configured to provide a plurality of target droplets 32 to a source vessel 72. A measuring device 50 is configured to measure the temperature TEMP of the source vessel 72, the droplet positions of the target droplets 32 and the pulse lasers 66, 66A and 66B. Furthermore, the process parameter regarding to a standard deviation σ on the droplet positions of the target droplets 32 is obtained. If the temperature TEMP of the source vessel 72 does not exceed a temperature threshold value TH_temp or is within a temperature range, the controller 40 determines that the target droplets are stable, and a plurality of pulse lasers (e.g., 66 of FIG. 2 or 66A and 66B of FIG. 3) are generated to irradiate the target droplets 32 in the source vessel 72. If the standard deviation σ does not exceed a standard deviation threshold value TH_SD or is within a standard deviation range, the controller 40 determines that the target droplets are stable, and the pulse lasers are also generated to irradiate the target droplets 32 in the source vessel 72. However, if the temperature TEMP of the source vessel exceeds the temperature threshold value TH_temp or is outside the temperature range and the standard deviation σ exceeds the standard deviation threshold value TH_SD or is outside the standard deviation range, the controller 40 determines that the target droplets 32 are unstable, and no pulse lasers are generated to irradiate the target droplets 32 in the source vessel 72. Thus, no unexpected debris 39 is generated when the controller 40 determines that the target droplets 32 are unstable, thereby contamination on the surface of the collector 36 is decreased. Therefore, the lifespan of the collector 36 is improved and then extended further. Also, the number of times that the collector 36 needs to be swapped is decreased. Furthermore, dose control and exposure quality can be secured due to more stable droplet conditions in the lithography exposing processes. Therefore, tool availability, productivity and reliability are also improved in the lithography exposing processes.

In some embodiments, a light source for extreme ultraviolet (EUV) radiation is provided. The light source includes a target droplet generator, a laser generator, and a controller. The target droplet generator is configured to provide a plurality of target droplets to a source vessel. The laser generator is configured to provide a plurality of first laser pulses according to a control signal to irradiate the target droplets in the source vessel, so as to generate plasma as the EUV radiation. The controller is configured to provide the control signal according to process parameters including a temperature of the source vessel and droplet positions of the target droplets. When the temperature of the source vessel exceeds a temperature threshold value and a standard deviation of the droplet positions of the target droplets exceeds a first standard deviation threshold value, the controller is configured to provide the control signal to the laser generator, so as to stop providing the first laser pulses.

In some embodiments, an extreme ultraviolet (EUV) lithography system for performing a lithography exposing process is provided. The EUV lithography system includes an EUV scanner and a light source. The light source is configured to provide EUV radiation to the EUV scanner in response to a control signal. The light source includes a collector, a target droplet generator, a laser generator, and a controller. The collector is configured to collect the EUV radiation and direct the EUV radiation to the EUV scanner. The target droplet generator is configured to provide a plurality of target droplets to a source vessel. The laser generator is configured to provide a plurality of first laser pulses according to the control signal to irradiate the target droplets in the source vessel, so as to generate plasma as the EUV radiation. The controller is configured to provide the control signal according to process parameters including a temperature of the source vessel and droplet positions of the target droplets. When the temperature of the source vessel exceeds a temperature threshold value and a standard deviation of the droplet positions of the target droplets exceeds a first standard deviation threshold value, the controller is configured to provide the control signal to the laser generator and the EUV scanner, respectively, so as to stop providing the first laser pulses and suspend the lithography exposing process.

In some embodiments, a method for performing a circuit layout patterning process is provided. The method includes receiving a substrate with a photoresist layer. The method includes generating an EUV radiation by providing a plurality of target droplets to a source vessel and providing a plurality of first laser pulses according to a control signal provided by a controller to irradiate the target droplets in the source vessel, so as to generate plasma as the EUV radiation. The method also includes directing the EUV radiation from the source vessel to the photoresist layer to form a patterned photoresist layer. The method further includes developing and etching the patterned photoresist layer to form a circuit layout. The EUV radiation is generated when at least one of the following conditions is satisfied: a temperature of the source vessel is within a temperature threshold value and a standard deviation of the droplet positions of the target droplets is within a first standard deviation threshold value.

In some embodiments, a method for performing a lithography process is provided. The method includes forming a photoresist layer over a substrate, providing a plurality of target droplets to a source vessel, and providing a plurality of first laser pulses according to a control signal provided by a controller to irradiate the target droplets in the source vessel to generate plasma as an EUV radiation. The plasma is generated when the control signal indicates a temperature of the source vessel is within a temperature threshold value. The method further includes directing the EUV radiation from the source vessel to the photoresist layer to form a patterned photoresist layer and developing and etching the patterned photoresist layer to form a circuit layout.

In some embodiments, a light source for EUV radiation is provided. The light source includes a target droplet generator and a laser generator. The target droplet generator is configured to provide a plurality of target droplets to a source vessel. The laser generator is configured to provide a plurality of first laser pulses to irradiate the target droplets in the source vessel to generate plasma as the EUV radiation when a standard deviation of droplet positions of the target droplets is within a standard deviation threshold value.

In some embodiments, an EUV lithography system for performing a lithography exposing process is provided. The EUV lithography system includes an EUV scanner and a light source. The light source is configured to provide EUV radiation to the EUV scanner. The light source includes a collector, a target droplet generator, and a laser generator. The collector is configured to collect the EUV radiation and direct the EUV radiation to the EUV scanner. The target droplet generator is configured to provide a plurality of target droplets to a source vessel. The laser generator is configured to provide a plurality of first laser pulses to irradiate the target droplets in the source vessel to generate plasma as the EUV radiation when a standard deviation of beam sizes of the first laser pulses is within a first standard deviation threshold value and a standard deviation of focal points of the first laser pulses is within a second standard deviation threshold value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for performing a lithography process, comprising:
   forming a photoresist layer over a substrate;
   providing a plurality of target droplets to a source vessel;
   providing a plurality of first laser pulses according to a control signal provided by a controller to irradiate the target droplets in the source vessel to generate plasma as an extreme ultraviolet (EUV) radiation, wherein the plasma is generated when the control signal indicates a temperature of the source vessel is less than an upper temperature threshold value and greater than a lower temperature threshold value;
   directing the EUV radiation from the source vessel to the photoresist layer to form a patterned photoresist layer; and
   developing and etching the patterned photoresist layer to form a circuit layout.

2. The method as claimed in claim 1, further comprising:
   measuring droplet positions of the target droplets; and
   providing a standard deviation of the droplet positions of the target droplets to the controller, wherein the plasma is no longer generated when the control signal indicates the temperature of the source vessel exceeds the upper temperature threshold value and the standard deviation of the droplet positions of the target droplets exceeds a first standard deviation threshold value.

3. The method as claimed in claim 1, further comprising:
   measuring beam sizes of the first laser pulses; and
   providing a standard deviation of the beam sizes of the first laser pulses to the controller, wherein the plasma is no longer generated when the control signal indicates the temperature of the source vessel exceeds the upper temperature threshold value and the standard deviation of the beam sizes of the first laser pulses exceeds a second standard deviation threshold value.

4. The method as claimed in claim 1, further comprising:
   measuring focal points of the first laser pulses; and
   providing a standard deviation of the focal points of the first laser pulses to the controller, wherein the plasma is no longer generated when the control signal indicates the temperature of the source vessel exceeds the upper temperature threshold value and the standard deviation of the focal points of the first laser pulses exceeds a third standard deviation threshold value.

5. The method as claimed in claim 1, further comprising:
   providing a plurality of second laser pulses to irradiate the target droplets to generate a plurality of target plumes; and
   providing the first laser pulses to irradiate the target plumes to generate the plasma as the EUV radiation.

6. The method as claimed in claim 1, further comprising providing a patterned beam and projecting the patterned beam onto the substrate.

7. The method as claimed in claim 1, wherein when the temperature of the source vessel is less than the upper temperature threshold value and greater than the lower temperature threshold value, data obtained by the controller is in a low logic level, and when the temperature of the source vessel exceeds the upper temperature threshold value, data obtained by the controller is in a high logic level.

8. A light source for EUV radiation, comprising:
   a target droplet generator configured to provide a plurality of target droplets to a source vessel; and
   a laser generator comprising a first laser source configured to produce a pre-pulse laser to pre-heat the target droplets and create a target plume and a second laser source configured to produce a main pulse laser to irradiate the target plume to generate plasma as the EUV radiation when a standard deviation of droplet positions of the target droplets is within a standard deviation threshold value, wherein a spot size of the main pulse laser is greater than a spot size of the pre-pulse laser.

9. The light source as claimed in claim 8, further comprising a collector configured to collect the EUV radiation.

10. The light source as claimed in claim 9, further comprising an illuminator configured to direct the EUV radiation collected by the collector.

11. The light source as claimed in claim 9, wherein the collector comprises a first window and a second window, and the pre-pulse laser from the first laser source and the main pulse laser from the second laser source are directed into the source vessel through the first window and the second window, respectively.

12. The light source as claimed in claim 8, further comprising a controller configured to provide a control signal to the laser generator.

13. The light source as claimed in claim 12, further comprising a droplet detector configured to measure the droplet positions of the target droplets and to provide the measured droplet positions to the controller.

14. An EUV lithography system for performing a lithography exposing process, comprising:
   an EUV scanner; and
   a light source configured to provide EUV radiation to the EUV scanner, wherein the light source comprises:
      a collector configured to collect the EUV radiation and direct the EUV radiation to the EUV scanner;
      a target droplet generator configured to provide a plurality of target droplets to a source vessel; and
      a laser generator configured to provide a plurality of first laser pulses to irradiate the target droplets in the source vessel to generate plasma as the EUV radiation when a standard deviation of beam sizes of the first laser pulses is within a first standard deviation threshold value and a standard deviation of focal points of the first laser pulses is within a second standard deviation threshold value.

15. The EUV lithography system as claimed in claim 14, further comprising a controller configured to provide a control signal to the laser generator.

16. The EUV lithography system as claimed in claim 15, further comprising a first beam detector configured to measure the beam sizes of the first laser pulses and to provide the measured beam sizes of the first laser pulses to the controller.

17. The EUV lithography system as claimed in claim 15, wherein the controller is further configured to perform an arithmetic calculation to calculate first derivatives of the beam sizes of the first laser pulses and first derivatives of the focal points of the first laser pulses.

18. The EUV lithography system as claimed in claim 16, further comprising a second beam detector configured to measure the focal points of the first laser pulses and to provide the measured focal points of the first laser pulses to the controller.

19. The EUV lithography system as claimed in claim 14, wherein the laser generator comprises:
   a first laser source configured to provide a plurality of second laser pulses to irradiate the target droplets to generate a plurality of target plumes; and
   a second laser source configured to provide the first laser pulses to irradiate the target plumes to generate the plasma.

20. The EUV lithography system as claimed in claim 14, wherein the EUV scanner is configured to illuminate a patterning mask with the EUV radiation to provide a patterned beam and project the patterned beam onto a semiconductor substrate in the lithography exposing process.

* * * * *